United States Patent
Wang et al.

(10) Patent No.: US 10,132,870 B2
(45) Date of Patent: Nov. 20, 2018

(54) DYNAMIC DISCHARGING TO DETECT DERATED BATTERY CELLS

(75) Inventors: Ligong Wang, Round Rock, TX (US); Shane Chiasson, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 1050 days.

(21) Appl. No.: 12/429,379

(22) Filed: Apr. 24, 2009

(65) Prior Publication Data

US 2010/0270975 A1  Oct. 28, 2010

(51) Int. Cl.
*G01R 31/36* (2006.01)
*H01M 10/48* (2006.01)

(52) U.S. Cl.
CPC ...... *G01R 31/3658* (2013.01); *H01M 10/482* (2013.01)

(58) Field of Classification Search
CPC .................................................. G01R 31/3658
USPC ....... 320/136, 149, 132, 133, 156, 157, 160, 320/161, 162
See application file for complete search history.

(56) References Cited

U.S. PATENT DOCUMENTS

| | | | | |
|---|---|---|---|---|
| 4,709,202 A * | 11/1987 | Koenck et al. | ............... | 320/112 |
| 4,965,738 A * | 10/1990 | Bauer et al. | .................... | 320/136 |
| 5,206,578 A * | 4/1993 | Nor | .................... | G01R 31/3658 |
| | | | | 320/118 |
| 5,352,982 A * | 10/1994 | Nakazawa et al. | ........... | 324/427 |
| 5,614,829 A * | 3/1997 | Song | ............................. | 324/427 |
| 5,627,453 A | 5/1997 | Sheehan et al. | | |
| 5,751,134 A * | 5/1998 | Hoerner | ............. | G01R 31/3613 |
| | | | | 320/124 |
| 5,936,383 A * | 8/1999 | Ng | ....................... | G01R 31/361 |
| | | | | 320/132 |
| 6,025,699 A | 2/2000 | Cummings | | |
| 6,031,354 A * | 2/2000 | Wiley et al. | .................. | 320/116 |
| 6,107,779 A * | 8/2000 | Hara et al. | ..................... | 320/132 |
| 6,114,836 A * | 9/2000 | Hagiwara | ............. | H02J 7/0063 |
| | | | | 320/132 |
| 6,294,894 B1 * | 9/2001 | Ochiai | ............... | G01R 31/3658 |
| | | | | 320/132 |
| 6,317,697 B1 * | 11/2001 | Yoshikawa et al. | ............ | 702/63 |
| 7,017,061 B2 * | 3/2006 | Lippert | ..................... | G06F 1/30 |
| | | | | 713/320 |
| 7,202,631 B2 | 4/2007 | Breen et al. | | |
| 7,362,074 B2 * | 4/2008 | Iwane et al. | .................. | 320/132 |
| 7,439,745 B2 * | 10/2008 | Suzuki et al. | ................. | 324/427 |
| 7,974,797 B2 * | 7/2011 | Shoji | .................. | G01R 31/3624 |
| | | | | 320/130 |
| 8,129,946 B2 * | 3/2012 | Wang | ................. | G01R 31/3679 |
| | | | | 320/132 |

(Continued)

*Primary Examiner* — Samuel Berhanu
*Assistant Examiner* — Tessema Kebede
(74) *Attorney, Agent, or Firm* — Terrile, Cannatti, Chambers & Holland, LLP; Stephen A. Terrile

(57) ABSTRACT

A system for dynamic discharging to detected derated battery cells. In such a system, a battery cell capacity, cell voltage, as well as a time to discharge are used in combination to identify good or bad battery cells. More specifically, during a dynamic discharge cycle, an accumulated discharge capacity value is calculated and monitored by a charge level battery gas gauge via analog to digital (A/D) converters and an internal discharge time value is monitored. One of the values is assigned as a fixed value and the other value is used to identify good or bad batter cells.

7 Claims, 4 Drawing Sheets

(56) References Cited

U.S. PATENT DOCUMENTS

| | | | |
|---|---|---|---|
| 8,129,947 B2* | 3/2012 | Chiasson | G01R 31/3679 320/132 |
| 2006/0022644 A1* | 2/2006 | Sakurai et al. | 320/132 |
| 2007/0145949 A1* | 6/2007 | Matsushima et al. | 320/132 |
| 2008/0120050 A1* | 5/2008 | Iwane et al. | 702/63 |
| 2009/0160402 A1 | 6/2009 | Wang et al. | |
| 2009/0248331 A1* | 10/2009 | Barsukov | G01R 31/3624 702/63 |

\* cited by examiner

DYNAMIC DISCHARGING TO DETECT DERATED BATTERY CELLS

BACKGROUND OF THE INVENTION

Field of the Invention

The present invention relates to information handling systems and more particularly to dynamic discharging to detect derated battery cells.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to provide backup power to an information handling system via a battery pack. For example with the PowerEdge Expandable redundant array of inexpensive disks (RAID) Controller (PERC) available from Dell, Inc., a battery pack is used to backup memory, (such as a dirty cache memory located on a PERC expansion card) when AC power is lost. One issue relating to the battery pack relates to the smart battery learn cycle.

In a known smart battery learn cycle, discharge ends before reaching an Under Voltage Protection mode of operation, where a discharge FET is off, e.g. from 100% to 10% relative state of charge (RSOC). To calibrate a coulomb counter, the PERC system completely discharges the battery system. Such an operation can be lengthy and can cause to user to encounter a period of degraded performance. For example, FIG. 1, labeled Prior Art, shows a learn cycle for a battery pack used with a PERC system.

Accordingly, it would be desirable to enable a controller to discharge only a small portion of battery capacity while maintaining accuracy.

SUMMARY OF THE INVENTION

In accordance with the present invention, a system for dynamic discharging to detect derated battery cells is set forth. In such a system, a battery cell capacity as well as a time to discharge are used in combination to identify good or bad battery cells. More specifically, during a dynamic discharge cycle, an accumulated discharge capacity value is calculated and monitored by a charge level battery gas gauge via analog to digital (A/D) converters and an internal discharge time value is monitored. One of the values is assigned as a fixed value and the other value is used to identify good or bad battery cells (e.g., derated cells). A derated cell is a battery cell whose capacity is below a defined threshold after a number of designated charge/discharge cycles after a defined period of time.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 2:
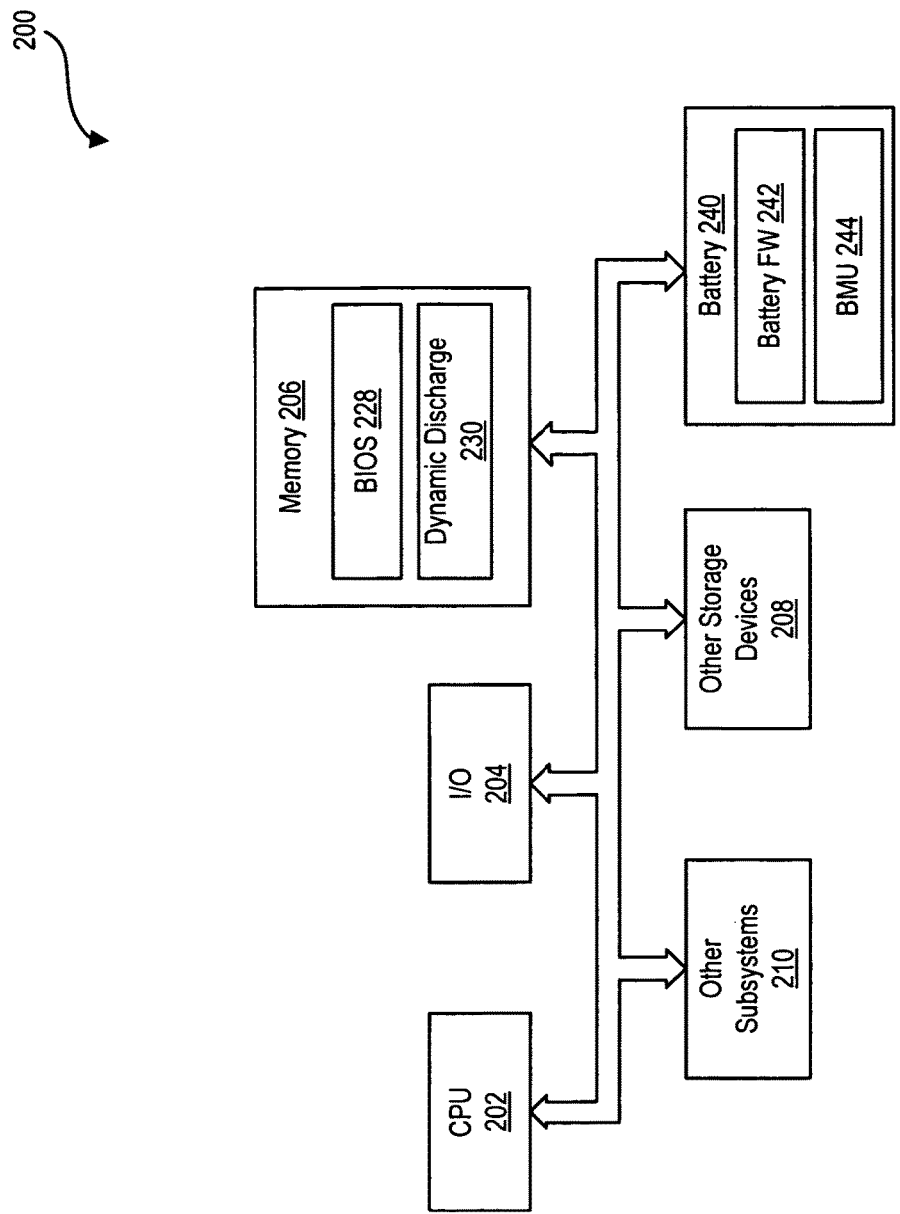
FIG. 2 shows a system block diagram of an information handling system.

Referring briefly to FIG. 2, a system block diagram of an information handling system 200 is shown. The information handling system 200 includes a processor 202, input/output (I/O) devices 204, such as a display, a keyboard, a mouse, and associated controllers, memory 206, including volatile memory such as random access memory (RAM) and non-volatile memory such as read only memory (ROM) and hard disk drives, and other storage devices 208, such as a floppy disk and drive or CD-ROM disk and drive, and various other subsystems 210, all interconnected via one or more buses 212. The memory 206 includes a basic input output system 228 as well as a dynamic discharge module 230. The information handling system 200 also includes a battery 240 coupled via the bus 212. The battery 240 includes battery firmware 242 as well as a battery management unit (BMU) 244. The battery 240 may include one or more battery cells. Additionally, the term battery refers to a single battery or to a battery pack.

The dynamic discharge module 230 performs a dynamic discharging operation to detect derated battery cells. In the dynamic discharge system 230, a battery cell capacity as well as a time to discharge are used in combination to identify good or bad battery cells. More specifically, during a learn cycle, an accumulated discharge capacity value of the battery 240 is calculated and monitored by a charge level battery gas gauge via analog to digital (A/D) converters and an internal discharge time value is monitored.

The accumulated discharge capacity is calculated as:

$$Cap=V*I*t; \text{ where}$$

V is the voltage of the battery;
I is the current of the battery; and,
t is the discharge time of the battery. However, in certain information handling systems which implement a PERC architecture, the capacity can be simplified as:

$$Cap=(V*V*t)/R, \text{ where}$$

V is the voltage of the battery; and,
R is a constant (e.g., in certain systems R—5.23 Ohms).
Thus, because the cell voltage is known value for either brand new or degraded cells, the only variables are discharge capacity (in Watt Hours (Whr) and time (in seconds/min.) With the dynamic discharge system 130, one of these values is assigned as a fixed value and the other value is used to identify good or bad battery cells.

The system detects derated or faulty cells (i.e., cells that have less than a predefined amount of discharge capacity at the end of discharge (e.g., 2.8 Whr for certain batteries)) within partial charge or discharge states when the RSOC at the end of discharge is 40% or higher (e.g., a RSOCstart-RSOCend<40% and RSOCend>50%).

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a network storage device or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 3:
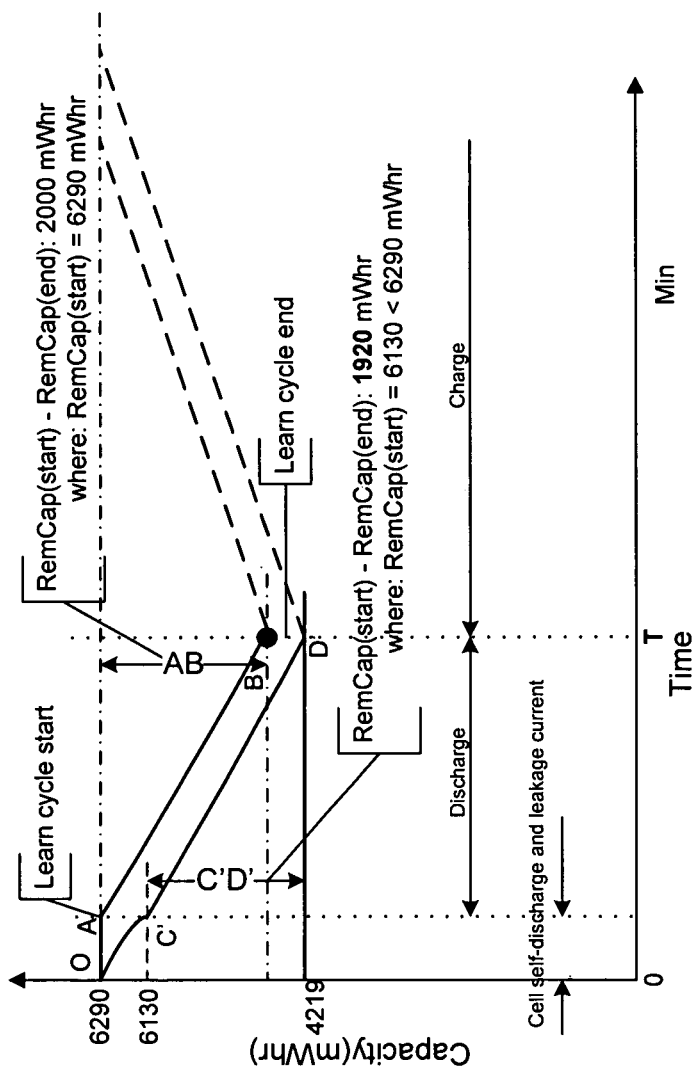
FIG. 3 shows a dynamic discharge cycle.

Referring to FIG. 3, an example dynamic discharge cycle is shown. More specifically, the system 130 identifies a dynamic discharge window shows as AB and C'D" to address a near full charge issue that is present in systems such as those that correspond to the PERC architecture. The system allows battery starting Quick Condition Cycle at any level close to full charge (e.g., >90% RSOC). The end of the discharge cycle is adjusted based upon the start condition and the capacity loss from full charge is compensated as needed.

Figure 1:
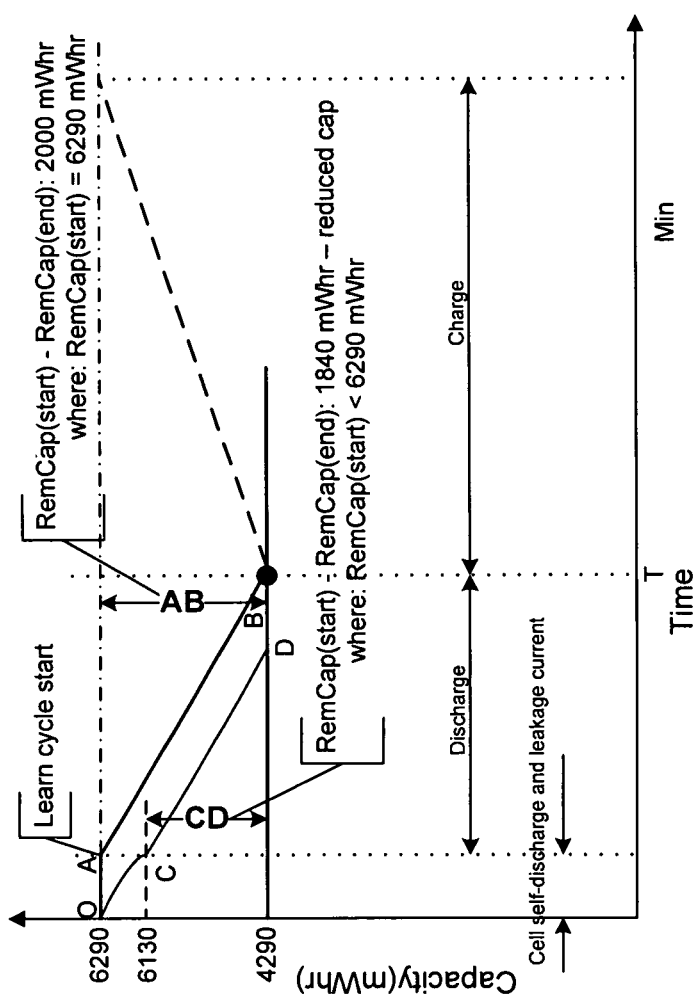
FIG. 1, labeled Prior Art, shows an example learning cycle.

Discharge stops at point D' (as compared to point D in the example shown in FIG. 1) and accumulated discharge capacity of 1920 mWhr is closer to a design value of 2000 mWhr (compared to the 1840 Whr shown in the example in FIG. 1). With a dynamic window C'D', the accuracy of detecting fault cells is improved with additional 10-20 minutes of discharge time and the error due to cell self discharge and circuit leakage is corrected.

Figure 4:
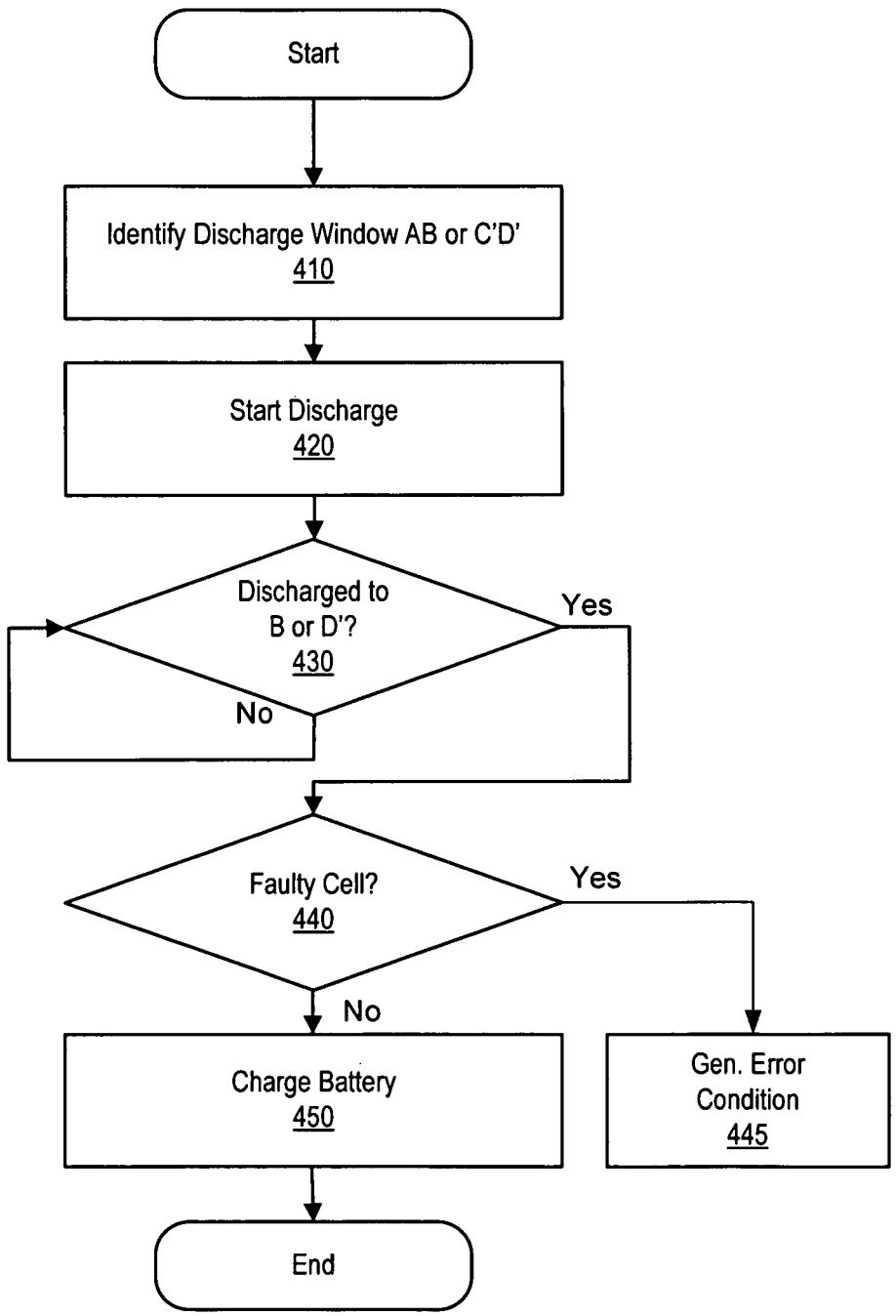
FIG. 4 shows a flow chart of the operation of a dynamic discharge system.

Referring to FIG. 4, a flow chart 400 of the operation of a dynamic discharge system is shown. More specifically, at step 410, the system identifies and selects a discharge window AB or discharge window C'D'. At step 520, the system starts to discharge the battery. Next, at step 430, the system determines whether the battery has discharged to a level B or D' depending on the selected discharge window. If not, then the system checks again after a time delay. If so, then the system determines whether a faulty cell is present at step 440. This information indicates a faulty cell is present because when measured discharge capacity is smaller than a designated value between a defined voltage window, the battery is referred to as a derated pack.

If a faulty cell is present, then the system generates an error condition at step 445. If a faulty cell is not present, then the system charges the battery at step 450. The operation completes after execution of ether step 445 or step 450.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling submodules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for dynamic discharging of a battery to detect derated battery cells within an information handling system, the information handling system comprising a memory and a battery, the memory comprising a basic input output system (BIOS) and a dynamic discharge module, the battery comprising a plurality of battery cells, battery firmware and a battery management unit, the method comprising:

identifying and selecting a dynamic discharge window from a first discharge window and a second discharge window;

determining an accumulated discharge capacity value for the battery, the determining the accumulated discharge capacity value being performed by the dynamic discharge module interacting with the battery, the accumulated discharge capacity value being calculated and monitored by a charge level battery gas gauge of the battery via analog to digital (A/D) converters;

determining an internal discharge time value for the battery, the determining an internal discharge time value being performed by the dynamic discharge module;

assigning one of the accumulated discharge capacity value and the internal discharge time value as a fixed value, the assigning one of the accumulated discharge capacity value and the internal discharge value being performed by the dynamic discharge module;

using another of the accumulated discharge capacity value and the internal discharge time value to identify derated battery cells, derated battery cells corresponding to battery cells having less than a predefined amount of discharge capacity after a number of designated charge/discharge cycles after a defined period of time, the using another of the accumulated discharge capacity value and the internal discharge time value being performed by the dynamic discharge module interacting with the battery; and, determining start and end voltage for the battery, the determining the start and end voltage for the battery being performed by the dynamic discharge module interacting with the battery; and wherein the assigning the fixed value comprises assigning one of the accumulated discharge capacity value, the start and end voltage and the internal discharge time value as the fixed value;

the using another further comprises using another of the accumulated discharge capacity value, the start and end voltage and the internal discharge time value to identify derated battery cells; the battery is used to backup memory within an expandable redundant array of inexpensive disks (RAID) controller; and, the information handling system implements a Power-Edge Expandable RAID Controller (PERC) architecture and the identifying and selecting the dynamic discharge window from the first discharge window and the second discharge window addresses a near full charge issue related to when the information handling system implements the PERC architecture;

the end of discharge cycle is adjusted based upon the start condition and the capacity loss is compensated from full charge.

2. The method of claim 1 wherein:
the accumulated discharge capacity is calculated during a dynamic discharge cycle.

3. The method of claim 1 further comprising:
determining a relative state of charge value for the battery; and wherein
the assigning the fixed value comprises assigning one of the accumulated discharge capacity value, the relative state of charge and the internal discharge time value as the fixed value; and,
the using another further comprises using another of the accumulated discharge capacity value, the relative state of charge and the internal discharge time value to identify derated battery cells.

4. An apparatus for dynamic discharging of a battery to detect derated battery cells within an information handling system, the information handling system comprising a memory and a battery, the memory comprising a basic input output system (BIOS) and a dynamic discharge module, the battery comprising a plurality of battery cells, battery firmware and a battery management unit, the apparatus comprising:

means for identifying and selecting a dynamic discharge window from a first discharge window and a second discharge window;

means for determining an accumulated discharge capacity value for the battery, the means for determining the accumulated discharge capacity value being performed by the dynamic discharge module interacting with the battery, the accumulated discharge capacity value being calculated and monitored by a charge level battery gas gauge of the battery via analog to digital (A/D) converters;

means for determining an internal discharge time value for the battery, the means for determining an internal discharge time value being performed by the dynamic discharge module;

means for assigning one of the accumulated discharge capacity value and the internal discharge time value as a fixed value, the means for assigning one of the accumulated discharge capacity value and the internal discharge value being performed by the dynamic discharge module;

means for using another of the accumulated discharge capacity value and the internal discharge time value to identify derated battery cells, derated battery cells corresponding to battery cells having less than a predefined amount of discharge capacity after a number of designated charge/discharge cycles after a defined period of time, the means for using another of the accumulated discharge capacity value and the internal discharge time value being performed by the dynamic discharge module interacting with the battery; and, means for determining start and end voltage for the battery, the means for determining the start and end voltage for the battery being performed by the dynamic discharge module interacting with the battery; and wherein assigning the fixed value comprises assigning one of the accumulated discharge capacity value, the start and end voltage and the internal discharge time value as the fixed value; and, using another further comprises using another of the accumulated discharge capacity value, the start and end voltage and the internal discharge time value to identify derated battery cells;

the battery is used to backup memory within an expandable redundant array of inexpensive disks (RAID) controller; and, the information handling system implements a Power-Edge Expandable RAID Controller (PERC) architecture and the identifying and selecting the dynamic discharge window from the first discharge window and the second discharge window addresses a near full charge issue related to when the information handling system implements the PERC architecture;

the end of discharge cycle is adjusted based upon the start condition and the capacity loss is compensated from full charge.

5. The apparatus of claim 4 wherein:
accumulated discharge capacity is calculated during a dynamic discharge cycle.

6. The apparatus of claim 4 further comprising:
means for determining a relative state of charge value for the battery; and wherein
assigning the fixed value comprises assigning one of the accumulated discharge capacity value, the relative state of charge and the internal discharge time value as the fixed value; and,
using another further comprises using another of the accumulated discharge capacity value, the relative state of charge and the internal discharge time value to identify derated battery cells.

7. A method for dynamic discharging of a battery to detect derated battery cells within an information handling system, the information handling system comprising a memory, a battery, and an expandable redundant array of inexpensive disks (RAID) controller, the memory comprising a basic input output system (BIOS) and a dynamic discharge module, the battery comprising a plurality of battery cells, battery firmware and a battery management unit, the method comprising:

identifying and selecting a dynamic discharge window from a first discharge window and a second discharge window;
determining an accumulated discharge capacity value for the battery, the accumulated discharge capacity corresponding to (V*V*t)/R, where V is a voltage of the battery, t is a discharge time for the battery and R is a constant, the determining the accumulated discharge capacity value being performed by the dynamic discharge module interacting with the battery, the accumulated discharge capacity value being calculated and monitored by a charge level battery gas gauge of the battery via analog to digital (A/D) converters;
determining an internal discharge time value for the battery, the determining an internal discharge time value being performed by the dynamic discharge module;
assigning one of the accumulated discharge capacity value and the internal discharge time value as a fixed value, the assigning one of the accumulated discharge capacity value and the internal discharge value being performed by the dynamic discharge module;
using another of the accumulated discharge capacity value and the internal discharge time value to identify derated battery cells, derated battery cells corresponding to battery cells having less than a predefined amount of discharge capacity after a number of designated charge/discharge cycles after a defined period of time, the using another of the accumulated discharge capacity value and the internal discharge time value being performed by the dynamic discharge module interacting with the battery; and,
determining start and end voltage for the battery, the determining the start and end voltage for the battery being performed by the dynamic discharge module interacting with the battery; and
wherein
the assigning the fixed value comprises assigning one of the accumulated discharge capacity value, the start and end voltage and the internal discharge time value as the fixed value;
the using another further comprises using another of the accumulated discharge capacity value, the start and end voltage and the internal discharge time value to identify derated battery cells;
the battery is used to backup memory within expandable redundant array of inexpensive disks (RAID) controller; and,
the identifying and selecting the dynamic discharge window from the first discharge window and the second discharge window addresses a near full charge issue related to when the information handling system implements the PERC architecture;
the end of discharge cycle is adjusted based upon the start condition and the capacity loss is compensated from full charge.

* * * * *